United States Patent [19]
Brown

[11] 3,987,538
[45] Oct. 26, 1976

[54] METHOD OF MAKING DEVICES HAVING CLOSELY SPACED ELECTRODES

[75] Inventor: David George Brown, Richardson, Tex.

[73] Assignee: Texas Instruments Incorporated, Dallas, Tex.

[22] Filed: Dec. 26, 1973

[21] Appl. No.: 427,862

[52] U.S. Cl. .................................. 29/577; 29/590; 29/591; 204/15; 357/24
[51] Int. Cl.² ........................................ B01J 17/00
[58] Field of Search .......... 204/15; 357/24; 29/571; 29/590, 591, 577

[56] References Cited
UNITED STATES PATENTS

| 3,738,917 | 6/1973 | Spath | 204/15 |
| 3,756,924 | 9/1973 | Collins | 204/15 |
| 3,775,262 | 11/1973 | Heyerdahl | 204/15 |

*Primary Examiner*—W. Tupman
*Attorney, Agent, or Firm*—Harold Levine; James T. Comfort; Richard L. Donaldson

[57] ABSTRACT

A method is provided for fabricating three-phase charge coupled devices having closely spaced electrodes. A two-level metalization technique is employed, the levels of metal being separated by an insulative layer of oxide. The oxide layer is produced by anodizing a portion of the first metal layer through diodes, applying a voltage to the back of the silicon substrate slice. The diodes are forward biased for the anodization step, and are reverse biased during use of the device, so as not to interfere with its operation.

14 Claims, 8 Drawing Figures

METHOD OF MAKING DEVICES HAVING CLOSELY SPACED ELECTRODES

FIELD OF THE INVENTION

This invention relates to semiconductor devices, and more particularly to devices wherein closely spaced electrodes are desirable or required.

BACKGROUND OF THE INVENTION

It has been previously proposed to employ a two-level metalization technique to produce charge coupled devices. For example, in the application of Collins et al, Ser. No. 130,358, filed Apr. 1, 1971, (now U.S. Pat. No. 3,756,924 issued Sept. 4, 1973) entitled "Semiconductor Device and Method of Fabrication," and assigned to the assignee of the present application, a procedure is disclosed for fabrication of a charge-coupled device. Two-level metalization is employed. To anodize the first level metal, e.g., aluminum, a metal buss bar is used to interconnect all electrodes paterned in the first level. A voltage is applied through the buss bar to the electrodes, to partially anodize the electrodes and thereby provide an electrically insulated layer over them.

In the identified Collins et al application, since not all of the electrodes of the first level were to be electrically connected during operation of the device, it was necessary to remove the buss bar after the anodization step. The identified application of Collins et al. suggests removal of the buss bar by either anodizing it to completion or by etching it away.

It is, of course, desirable in fabricating semiconductor devices to use as few steps as possible, and to fabricate with the greatest reliability possible.

It is accordingly a feature of the present invention to provide a method of fabricating three-phase charge coupled devices having closely spaced electrodes, employing fewer steps than were previously required.

A further feature of the invention is to provide a method of fabricating such devices more reliably than was possible with previous techniques.

Other objects and advantages of the invention will be apparent to persons skilled in the art from a consideration of this specification, including the claims and the drawing.

SUMMARY OF THE INVENTION

In accordance with the present invention, anodization of the first-level metal is accomplished through diodes diffused into the slice, applying the anodizing voltage to the back of the slice. The diodes are forward biased for the anodizing step, and reverse biased in operation of the device. No buss bars are required to interconnect the electrodes for anodization. Consequently, no buss-bar-removal steps are required. The anodizing diodes may be diffused into the silicon substrate either as individual dots, one dot contacting each electrode, or as long strips replacing the aluminum clock lines. After anodization, a second level of metal is laid down and patterned, completing the device.

DETAILED DESCRIPTION OF PREFERRED EMBODIMENTS

Figure 1:
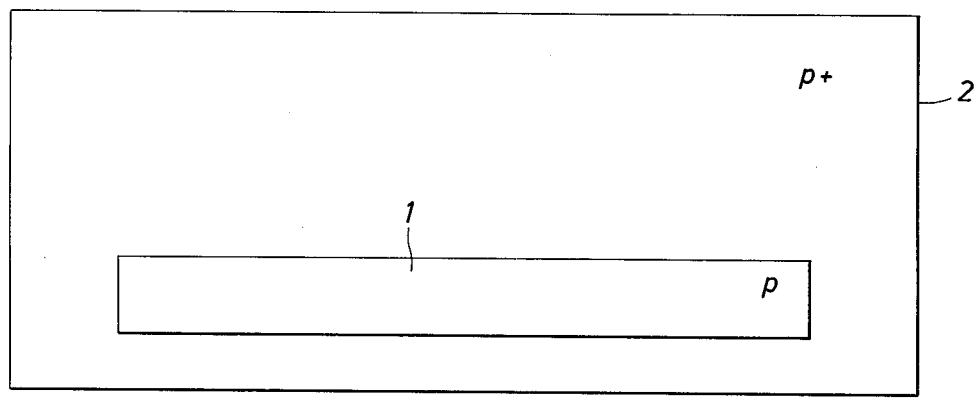
FIG. 1 is an illustration of a slice, containing a channel of p-type material.

It is preferred to start with a channel of p-type silicon material surrounded by p+ material. Referring to FIG. 1 of the drawings, a channel 1 of p-type silicon is shown, in a slice 2 containing surrounding p+ silicon material.

Figure 2:
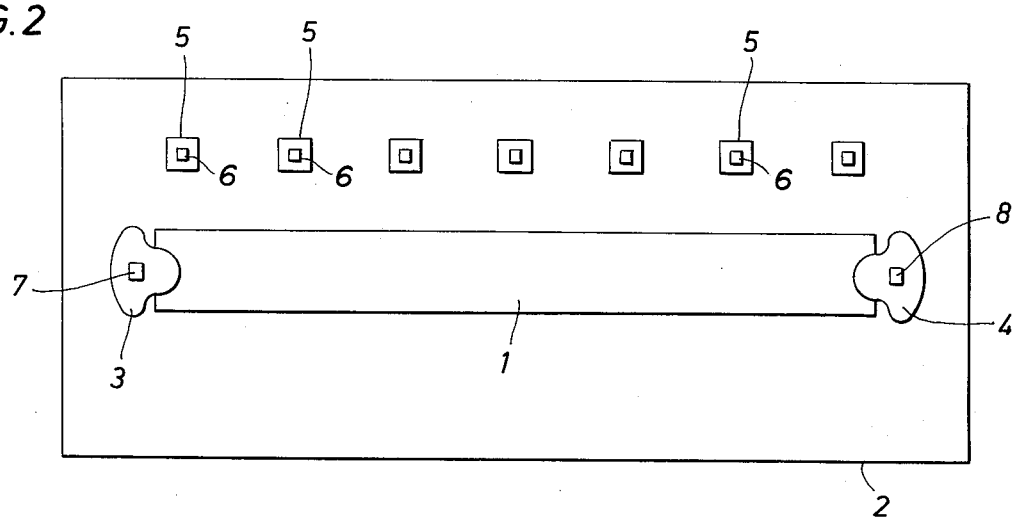
FIG. 2 is a plan view of the slice, after the anodization diodes have been diffused and contacts etched.

The first step in the fabrication method of the present invention involves diffusing diodes, in this case of n+ material, into the substrate. Referring now to FIG. 2 of the drawings, an input diode 3 and an output diode 4 are shown diffused into the slice 2. These diodes, of n+ type material, are diffused in conventional fashion. In accordance with the present invention, however, anodization diodes 5 are also diffused into the substrate, in a pattern corresponding to the spacing of first-level electrodes, as will be hereinafter explained. A layer of insulative material, for example, silicon dioxide, is then laid down on the substsrate, in conventional fashion. Contact openings 6, 7 and 8 are etched over the anodization diodes, input diodes and output diodes, respectively, also be conventional means known in the art.

Figure 3:
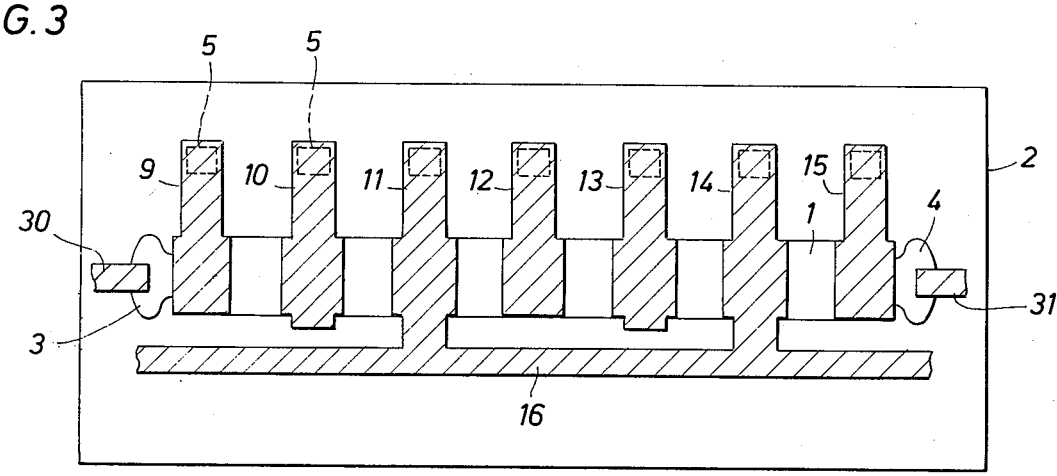
FIG. 3 is a plan view of the slice, after patterning the first-level electrodes and clock line.

A first level of metal, for example, aluminum, is then laid down and patterned as illustrated in FIG. 3. This metal layer may typically have a thickness of an average of 7,000 A. By suitable masking and etching techniques, electrodes 9–15 may be patterned as shown in FIG. 3. Each of the electrodes 9–15 is seen to have a portion overlying one of the anodization diodes 5. A long metal strip 16 is also in the pattern as shown, and will become one of the clock lines (phase 2), as later to be described. Additionally, an input lead line 30 and an output lead line 31 may be included in the first-level metal pattern.

Figure 4:
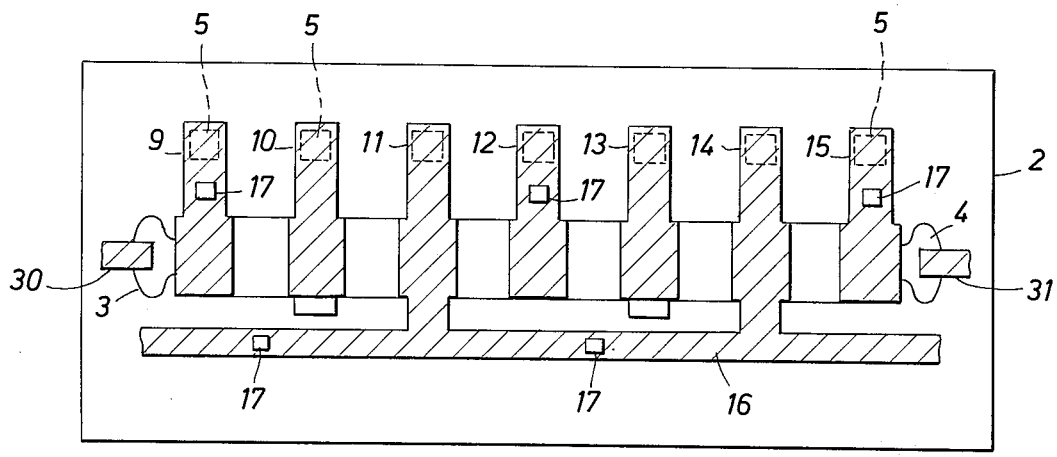
FIG. 4 is a plan view of the slice, after anodization of the first-level metal.

The next step is to mask certain areas of the electrodes and clock line strip 16 as vias. Referring now to FIG. 4 of the drawings, via areas are shown at 17. These vias will not be anodized and will serve to connect electrically the first and second metalization layers. The patterned metal components shown in FIG. 4 are then anodized, anodization being carried out to a thickness of perhaps 2,000–3,000 angstroms. The method of anodization according to the present invention will be described with reference to FIG. 5.

Figure 5:
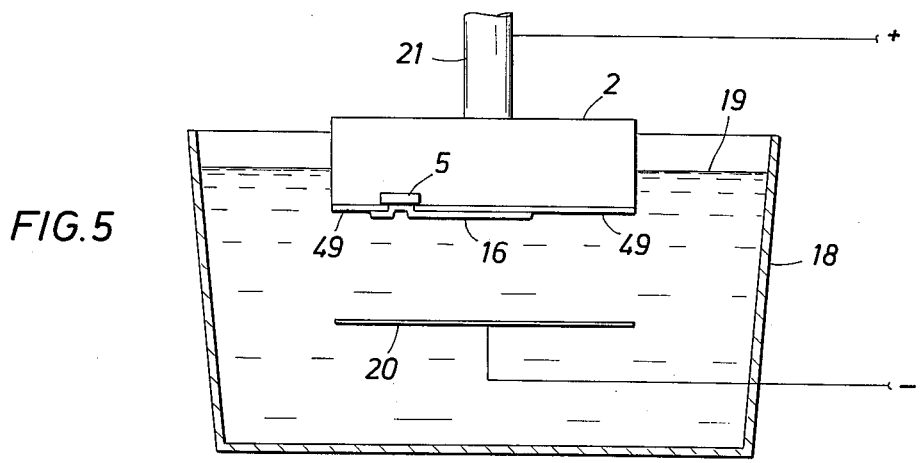
FIG. 5 is an illustration of the anodization step.

Referring to FIG. 5 of the drawings, a container 18 holding an electrolytic bath 19, includes a cathode 20, to which the negative side of a voltage is applied. The slice 2 is held, by means of a vacuum, to a stainless steel tube 21, to which the positive side of the anodizing voltage is applied. Since the anodization diodes 5 are forward biased for such a voltage, anodizing current flows from the tube 21, to the slice 2, to the anodization diodes 5, to the electrodes 9–17, to the bath 19, and to the cathode 20. It will be recalled that, as stated above, the insulative layer of silicon dioxide 49 was etched through to the diodes 5.

Figure 6:
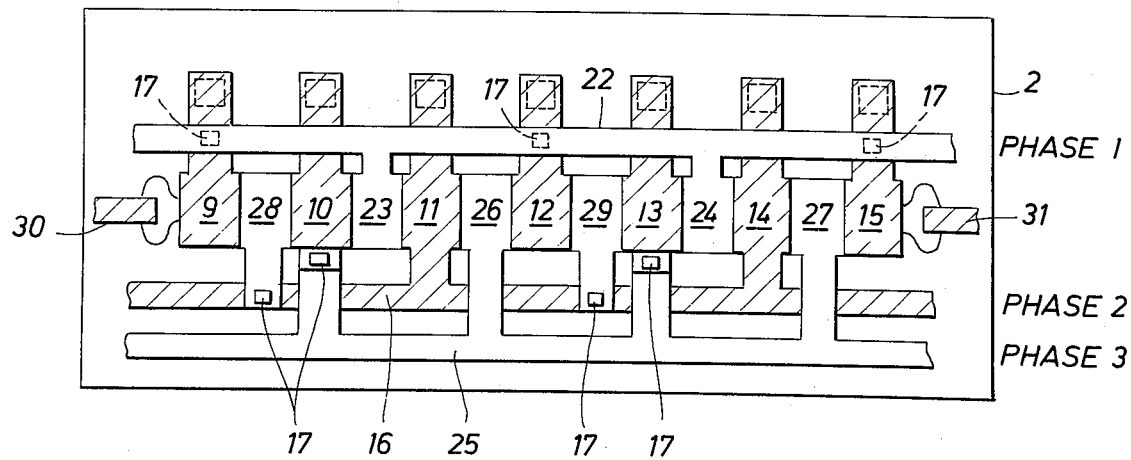
FIG. 6 is a plan view of the completed device, after patterning of the second-level electrodes and clock lines.

Having thus anodized the entire surface of the patterned first level metal, except for the vias 17, a second level of metal is deposited, for example, in the pattern shown in FIG. 6 of the drawings. Here it is seen that a second clock line 22 (phase 1) interconnects second-level metal electrodes 23 and 24, and also connects through to first-level metal electrodes 9, 12 and 15 through the respective vias 17. A third clock line 25 (phase 3) is formed to connect second-level metal electrodes 26 and 27, and also to connect through to first-level metal electrodes 10 and 13, through the appropriate vias 17. Second-level metal electrodes 28 and 29 connect through to the first clock line 16 through the respective vias 17, as shown in FIG. 6.

From the above description it will be seen that any two adjacent electrodes are spaced apart by only the thickness of the anodized layer, which, as stated above, may be very small, for example, 2,0000–3,000 angstroms.

In this manner a three-phase charge-coupled device is made, without having to employ buss bars for anodization, and consequently without the necessity of removing the buss bars after the anodization step.

Figure 7:
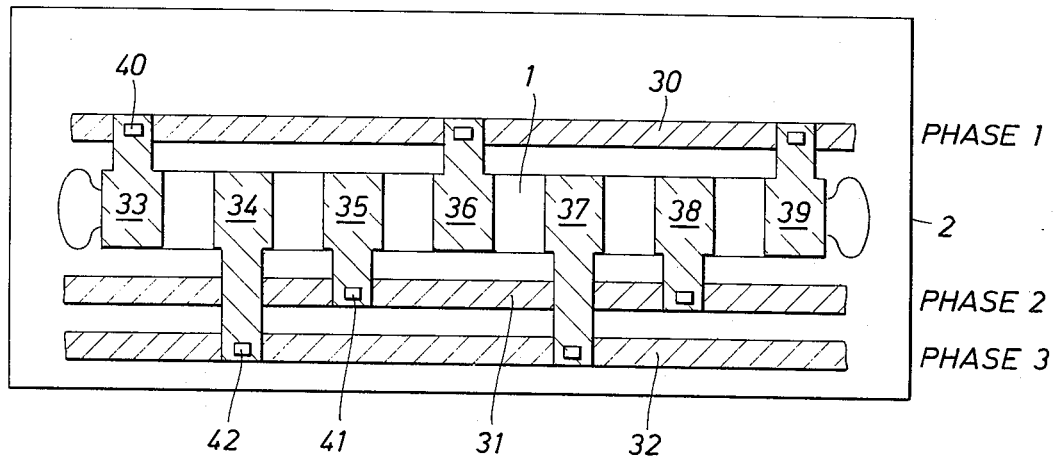
FIGS. 7 and 8 illustrate an alternative layout for a three-phase charge-coupled device, fabricated according to the method of the present invention.
Figure 8:
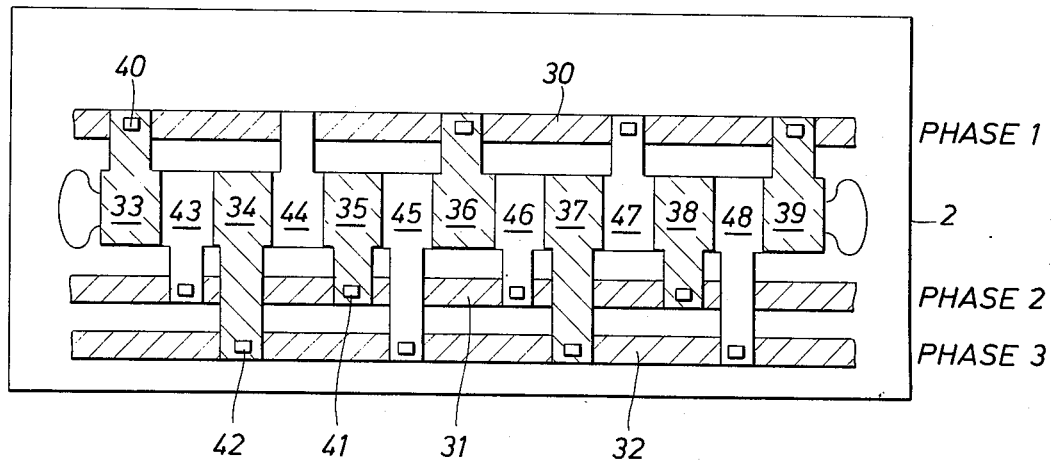

The particular layout of electrodes as above described is not the only possible way of employing the method of the present invention. An alternative layout is illustrated in FIGS. 7 and 8 of the drawings. Referring now to FIG. 7, a channel 1 is shown in a slice 2 as before. However, instead of diffusing the anodization diodes as separate spots corresponding to the location of various electrodes, here the diodes are diffused in long strips 30–32, replacing the aluminum clock lines. First-level electrodes 33–39 are patterned as shown in FIG. 7, making contact through etched contacts such as 40–42.

Anodization through the back of the slice is accomplished as before.

A second level of metal is then deposited and patterned as shown in FIG. 8 of the drawings, wherein electrodes 43–48 are of second-level metal. This technique results in fewer metal-to-metal crossovers, and less space is used up.

In the operation of a charge-coupled device, which is described basically in such references as *Electronics*, May 11, 1970, pp. 112–118, closeness of electrode spacing is an important design objective, because closer spacing permits faster transfers of charge with less loss than when the electrodes are wider spaced from each other.

It should be understood that various changes could be made in the techniques above described, all within the present invention, the scope of the invention being defined by the following claims.

What is claimed is:

1. A method of fabricating electrodes of a charge coupled device comprising the steps of:
   a. forming regions of one conductivity type in a surface of a semiconductor substrate of opposite conductivity type to provide anodization diodes beneath insulation overlying said surface;
   b. forming a first patterned array of parallel, spaced metal electrodes on said insulation in electrical communication with said diodes through said insulation with selected ones of said electrodes formed as transverse projections from a first elongated clock line strip electrode formed adjacent said insulation;
   c. anodizing surface areas less than the total thickness of said electrodes by passing anodizing current through a circuit including said diodes and said electrodes, said current passing through said diodes solely in a forward direction; and
   d. forming a second patterned array of parallel spaced metal electrodes on said insulation, selected ones of the electrodes of said second array formed as transverse projections from a second elongated clock line strip electrode formed ajacent said insulation and extending parallel to said first clock line electrode, the electrodes of said second array being interleaved with the electrodes of said first array, and said anodized surfaces providing insulation between electrodes of said first and second arrays.

2. A method according to claim 1, wherein said semiconductor substrate is a p-type silicon substrate, said regions of one conductivity type are n-type regions and during said step (c), the substrate is connected to the positive terminal of an anodization current supply.

3. A method according to claim 1, wherein said electrodes are formed in electrical communication with respective anodization diodes.

4. A method according to claim 1, wherein said first and second clock line electrodes comprise metal electrodes formed on said insulation and said selected electrodes of the first and second arrays are integral with said first and second clock line electrodes respectively.

5. A method according to claim 4, wherein the semiconductor layer is a p-type layer, and wherein during said step (c), the semiconductor layer is connected to the positive terminal of an anodization current supply.

6. A method according to claim 1, wherein said first and second clock line electrodes comprise parallel spaced elongated doped regions of said one conductivity type in said elongated doped regions additionally defining said anodization diodes.

7. A method according to claim 6, wherein said semiconductor substrate is a silicon substrate and said metal electrodes are aluminum electrodes.

8. A method of making a three-phase charge-coupled device, comprising the steps of:
   a. diffusing anodization diodes in a semiconductor substrate;
   b. depositing an insulation layer over said substrate and said diodes;
   c. etching contact openings through said insulataion layer to said diodes;
   d. patterning a first level of deposited metal on the substrate, to define metal elements including spaced first level electrodes and a first clock line with said first level electrodes electrically communicating with said diodes through said contact openings, said first level electrodes comprising first, second and third electrode groups, said first electrode group electrically communicating with said first clock line;
   e. anodizing the services of said first level electrodes and said first clock line, by passing anodizing current through said substrate, diodes, first level electrodes and first clock line, except for via areas on said first clock line and said second and third electrode groups of said first level electrodes, said vias positioned for accessing a second level of metal elements, said current passing through said diodes in a forward direction; and
   f. patterning a second level of deposited metal on said substrate, to define metal elements including spaced second level electrodes interleaved with said first level electrodes and insulated therefrom by said anodized surfaces said second level electrodes comprising first, second and third electrode groups, said first electrode group of second level electrodes electrically communicating through vias with said first clock line, said second electrode groups of said first level electrodes and of said second level electrodes electrically communicating with said second clock line, and said third electrode groups of that first level electrodes and of said second level electrodes electrically communicating with said third clock line.

9. The method of claim 8 wherein said substrate is p-type material.

10. The method of claim 8 wherein the metal for said first-and second-level electrodes is aluminum.

11. The method of claim 8 further comprising simultaneously diffusing input and output diodes for said charge coupled device during said anodization-diode diffusion step.

12. A method according to claim 8, wherein each first level metal electrode electrically communicates with an individual anodization diode.

13. A method according to claim 8, wherein three elongated anodization diodes are formed in said semiconductor substrate and wherein each of said first, second and third electrode groups of said first level electrodes electrically communicates with an individual one of said diodes.

14. A method of fabricating electrodes of charge-coupled device comprising the steps of:

a. forming regions of one conductivity type on a surface of a semiconductor substrate of opposite conductivity type to provide a plurality of anodization diodes beneath an insulating layer overlying said surface;

b. forming a first level patterned array of metal elements on said insulation layer, said metal elements including a plurality of spaced apart electrodes comprising first, second and third electrode groups and a first clock line electrically communicating with said first electrode group;

c. connecting said metal elements including said plurality of said spaced apart electrodes and said first clock line in an electrical circuit including said anodization diodes and passing anodizing current through said circuit through said diodes in a forward direction to anodize surfaces of said first level metal elements; and d. forming a second level patterned array of metal elements overlying said first level array, said second array comprising:

i. metal electrodes comprising first, second and third electrode groups interleaved with said first level electrodes with said anodized surfaces providing insulation between said first and second level electrodes, said first electrode groups of said second level patterned array electrically communicating with said first clock line; and ii. second and third clock lines electrically communicating with said second and third electrode groups, respectively, of said first and second level electrodes, to define a three-phase electrode array for said charge-coupled device.

* * * * *